United States Patent [19]
Kontra et al.

[11] Patent Number: 5,711,858
[45] Date of Patent: Jan. 27, 1998

[54] PROCESS FOR DEPOSITING A CONDUCTIVE THIN FILM UPON AN INTEGRATED CIRCUIT SUBSTRATE

[75] Inventors: Richard Steven Kontra, Burlington, Vt.; Thomas John Licata, Lagrangeville, N.Y.; James Gardner Ryan, Newtown, Conn.; Timothy Dooling Sullivan, Underhill, Vt.

[73] Assignee: International Business Machines Corporation, Armonk, N.Y.

[21] Appl. No.: 496,999

[22] Filed: Jun. 30, 1995

Related U.S. Application Data

[63] Continuation of Ser. No. 226,530, Apr. 12, 1994, abandoned.

[51] Int. Cl.$^6$ .................................................. C23C 14/34
[52] U.S. Cl. ........................... 204/192.15; 204/192.12; 204/192.17; 204/298.11
[58] Field of Search .................. 204/192.12, 192.15, 204/192.17, 192.3, 298.11, 298.13

[56] References Cited

U.S. PATENT DOCUMENTS

| | | | |
|---|---|---|---|
| 4,433,004 | 2/1984 | Yonezawa et al. | 427/38 |
| 4,561,009 | 12/1985 | Yonezawa et al. | 357/67 |
| 4,724,060 | 2/1988 | Sakata et al. | 204/298 |
| 4,824,544 | 4/1989 | Mikalesen et al. | 204/298 |
| 4,988,423 | 1/1991 | Yamamoto et al. | 204/192.17 |
| 4,999,096 | 3/1991 | Nihei et al. | 204/192.3 |
| 5,019,891 | 5/1991 | Onuki et al. | 357/70 |
| 5,171,412 | 12/1992 | Talieh et al. | 204/192.15 |
| 5,223,108 | 6/1993 | Hurwitt | 204/298.11 X |
| 5,330,628 | 7/1994 | Demaray et al. | 204/192.12 |

FOREIGN PATENT DOCUMENTS

| | | | |
|---|---|---|---|
| 440 377 | 8/1991 | European Pat. Off. | |
| 0 509 305 | 10/1992 | European Pat. Off. | |
| 60-95954 | 5/1985 | Japan | 257/771 |
| 0310965 | 12/1988 | Japan | 204/298.11 |
| 1-289140 | 11/1989 | Japan | 257/771 |
| 1160896 | 10/1991 | U.S.S.R. | 257/771 |
| 92013360 | 8/1992 | WIPO | 257/771 |

OTHER PUBLICATIONS

Vossen et al., "Thin Film Process", Academic Press 1978, pp. 14–17.

T. J. Licata, et al., Mat. Res. Soc. Symp. Proc., "The Effect of Collimation on Sputtered AlCuSi and AlMg Microstructures and Electromigration Failure Characteristics", vol. 309, 1993.

L. K. Fionova, et al., Thin Solid Films, 227 (1993), pp. 54–58, "The structure and electromigration behaviour of aluminium films deposited by the partially ionized beam technique", 1993.

S. M. Rossnagel, et al., J. Vac. Sci. Technol. A 9 (2), pp. 261–265, "Collimatd Magnetron Sputter Deposition", Mar./Apr. 1991.

*Primary Examiner*—Nam Nguyen
*Attorney, Agent, or Firm*—Steven J. Soucar; Dale M. Crockatt

[57] ABSTRACT

An improved process for depositing a conductive thin film upon an integrated circuit substrate by collimated sputtering is disclosed. The sputtered films are alloys of aluminum; a preferred alloying metal is magnesium. The sputtered films of the invention have a more uniform orientation of grains than sputtered aluminum copper silicon alloy films. Such processes are especially useful in the fabrication of integrated circuit devices having aluminum alloy wiring elements.

18 Claims, 4 Drawing Sheets

○ = COL. ALMG, U=60 HR, S=.62
⊕ = UNCOL. ALMG, U=5.6, S=.53
▽ = COL. ALCUSI, U=10.4, S=.53
▼ = UNCOL. ALCUSI, U=9.6, S=.37

PROCESS FOR DEPOSITING A CONDUCTIVE THIN FILM UPON AN INTEGRATED CIRCUIT SUBSTRATE

This application is a continuation of U.S. Ser. No. 08/226,530, filed Apr. 12, 1994, and entitled "Process for Depositing a Conductive Thin Film Upon an Integrated Circuit Substrate, now abandoned.

BACKGROUND OF THE INVENTION

1. Field of the Invention

The present invention relates generally to processes for depositing conductive thin films upon an integrated circuit substrate. More particularly, the invention relates to a process for depositing aluminum alloy thin films by highly directional means such as collimated sputtering, and articles produced thereby. Such processes are especially useful in the fabrication of integrated circuit devices having aluminum alloy wiring elements.

2. Brief Description of Related Art

Sputter deposition is a well known process for depositing many of the conductive materials used to form the interconnecting wiring elements of integrated circuits. In conventional sputtering processes, the microstructure and properties of the deposited material are typically controlled by adjusting conventional sputter parameters such as gas pressure, cathode power, substrate temperature, and bias. However, conventional sputtering processes do not yield conformal, void-free deposited films over highly non-planar surfaces. In such cases, the use of collimated sputtering, where sputtered fill is enhanced by restricting the angular divergence of the sputtered flux, is advantageous.

U.S. Pat. No. 5,171,412 describes a collimated sputtering process comprising two distinct deposition steps which process is directed to the improved filling of depressions in the substrate and the reduction of voids in the deposited material. The patent specifically discloses the deposition of an aluminum, or alternatively titanium, first layer and the deposition of an aluminum second layer.

U.S. Pat. No. 4,824,544 describes a deposition system comprising a hollow cathode electron source in combination with a magnetron sputter deposition plasma device within a containment chamber having a particle collimation filter interposed between the cathode surface and the substrate, the disclosure of which is herein incorporated by reference.

U.S. Pat. No. 4,724,060 describes an apparatus for collimated sputtering which produces films with improved step coverage and hole filling.

U.S. Pat. No. 4,433,004, and the related U.S. Pat. No. 4,561,009, describe a semiconductor device comprising aluminum alloy wiring elements and a method for the formation thereof. Disclosed aluminum alloys include aluminum magnesium alloys. Disclosed deposition methods include conventional sputtering processes.

EP 0509305 A discloses a process for depositing conductive materials by a collimated sputtering process to produce films having improved hole filling properties.

S. M. Rossnagel, D. Mikalsen, H. Kinoshita and J. J. Cuomo, J. Vac. Sci. Technol. A9, 261, 1991, discloses a collimated magnetron sputter deposition technique for depositing films that are compatible with lift-off patterning techniques and improved hole filling.

Directionally controlled deposition methods are advantageous for producing films with improved step coverage and hole filling. However, known methods for producing directionally deposited metal films do not improve the electromigration failure resistance of conventional aluminum (Al) alloys comprising copper (Cu), silicon (Si), or other alloying elements when they are present at conventional concentrations greater than their solubility limits, and such methods do not change attributes of the microstructure such as grain orientation, grain size and precipitate distribution which cause such an improvement in the electromigration failure resistance. At conventionally used concentrations greater than their solubility limits, such alloying elements form incoherent precipitates that are structurally discrete from the surrounding lattice and inhibit refinement of the microstructure to more desirable states.

Nevertheless, elements such as Cu and Si are commonly added to integrated circuit wiring elements comprising aluminum to obtain improvements in reliability. In AlCuSi wiring, the copper atoms enhance electromigration lifetime by segregating to grain boundaries and retarding Al diffusion along the high diffusivity paths at such boundaries. Si likewise forms incoherent-precipitates, though these are scattered generally throughout the lattice and are useful in terms of reducing the rate of reaction of Al with underlying metals, and preventing undesirable diffusion of the Al into an underlying Si substrate. However, the benefit of alloying with copper is temporary, since Cu atoms diffuse quickly through Al and are locally depleted from line segments due to the "electron wind". The remaining structure is then susceptible to rapid breakdown from electromigration.

Thus, there is a need for a process which provides a directionally controlled deposition method and also provides a reduced incidence of electromigration failure in wiring elements formed from the film.

The known art does not disclose nor suggest the surprising discovery that by selecting particular aluminum alloys for use in a collimated sputtering process, the artisan can produce films with unexpectedly advantageous microstructural properties characterized by improved grain orientation and texture and the lack of incoherent precipitates, which results in improved resistance to electromigration failure.

SUMMARY OF THE INVENTION

It is an object of this invention to provide an improved process for depositing aluminum alloy thin film structures on semiconductor substrates.

It is yet another object of this invention to provide an improved process for filling high aspect ratio trenches or holes in a substrate.

It is yet another object of this invention to provide an aluminum thin film having improved microstructure within the deposited metal film. By microstructure is meant one or many properties of the deposited film, such as grain orientation and texture, grain size, presence or absence of certain precipitates such as coherent or incoherent precipitates, and presence or absence of line and plane defects such as dislocations and stacking faults.

It is yet another object of this invention to provide an aluminum thin film having improved microstructure, but lacking incoherent precipitates within the deposited metal grains.

It is yet another object of this invention to provide an aluminum thin film having improved microstructure, and having coherent precipitates within the deposited metal grains.

It is yet another object of this invention to provide an aluminum thin film for integrated circuit fabrication, which, when formed into a wiring element, has a reduced susceptibility to electromigration failure.

According to the invention, disclosed is an improved process for depositing a conductive thin film comprising aluminum upon an integrated circuit substrate by selecting particular aluminum alloys and depositing said alloys by a directionally controlled deposition process. The directionally controlled deposition process may be directionally controlled by a mechanical means or by an electric or magnetic field means acting on a charged species. The mechanical means may be collimated sputtering, or long throw sputtering. By long throw sputtering is meant a large separation between the source of the deposited species and the substrate. Preferred alloying metals are magnesium, niobium, palladium, and scandium. A particularly preferred alloying metal is magnesium. The sputtered films of the invention have a more uniform orientation and texture of grains than well known and commonly used sputtered aluminum copper alloy films. Integrated circuit wiring elements fabricated from such films have the advantage of a reduced tendency towards electromigration failure.

DETAILED DESCRIPTION OF THE PREFERRED EMBODIMENTS

Increasing integrated circuit densities produce higher metal wiring aspect ratios, which are more difficult to fill with deposited metal for damascene processing. By damascene processing is meant a method for fabricating integrated circuit wiring elements comprising the step of defining an opening in an insulating structure, followed by the step of filling the opening with conductive material, followed by removing a portion of the conductive material to planarize the top surface of the conductive feature with the top surface of the insulating structure. It is advantageous in such processes to control the direction of the deposition flux, and to avoid randomizing the directionally controlled flux by using low process pressures corresponding to high sputtered atom mean free paths. Directional control may be by the use of mechanical means, such as by interposing a collimator between the source and the substrate, or by the use of a large separation between the source and the substrate, or may be by subjecting a charged, moving deposition species to an electric or magnetic field.

Figure 1:
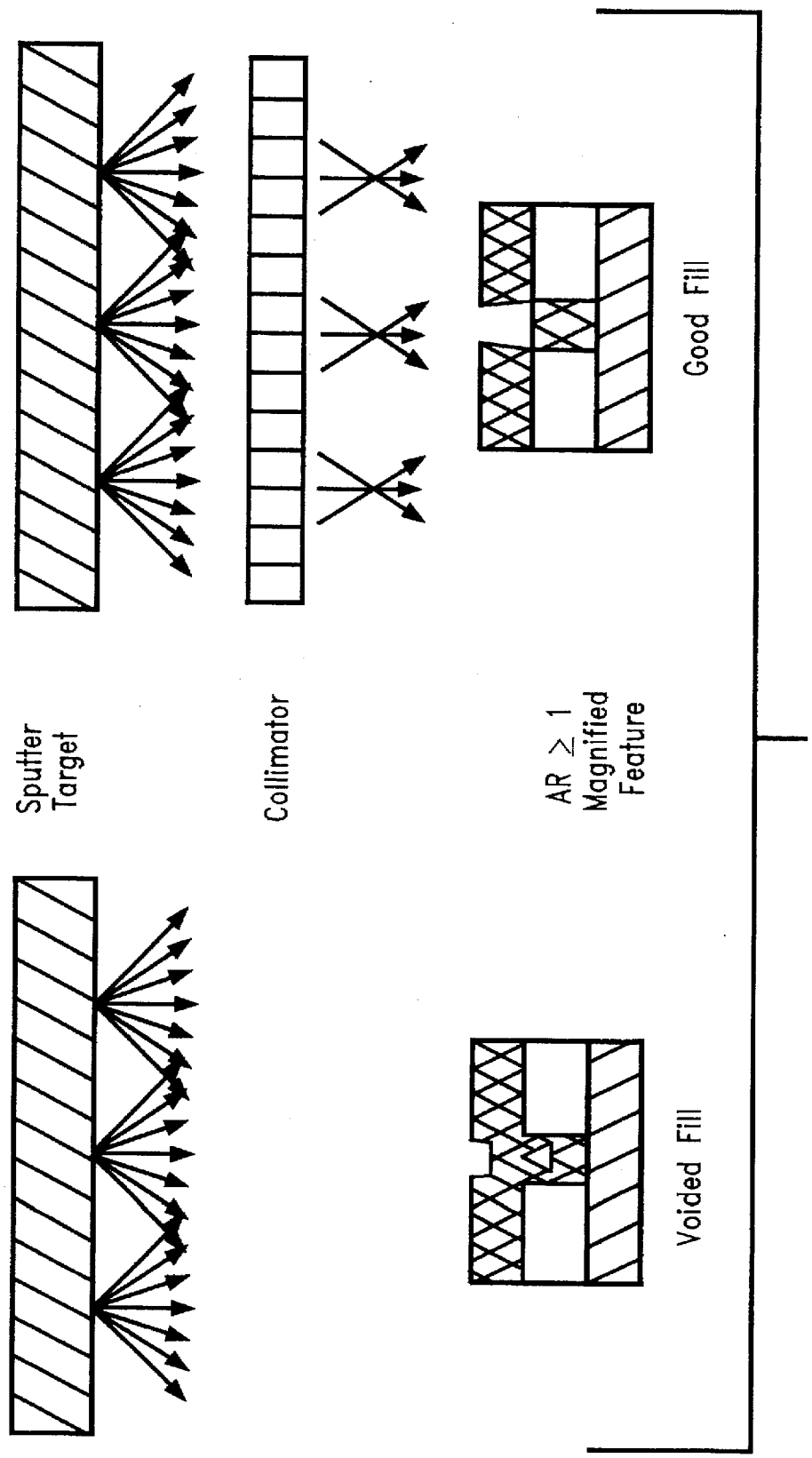
FIG. 1 shows a schematic view of two deposition processes, one of which is an uncollimated sputtering process and one of which is a collimated sputtering process.

The use of a collimator in a deposition apparatus is disclosed in U.S. Pat. Nos. 4,824,544, and 4,724,060, the disclosure of which are herein incorporated by reference. The effect of collimation on sputtered atom directional distribution and fill of substrate features is schematically shown in FIG. 1. For uncollimated deposition, the initial directional distribution of sputtered target atoms and subsequent gas phase collisions at typical sputtering pressures (several mT or more) yield atoms incident on the substrate from all directions. Thus, fill or bottom coverage of high aspect ratio holes or trenches are inhibited by the large difference in the sputtered atom acceptance angles corresponding to the features top and bottom surfaces. Typically, attempts at filling such structures produce cusped deposits characterized by voids near the center and pinholes in the lower corners. In addition, since more material deposits on the upper surface than on the lower surface, a large overburden is left for subsequent planarization. By contrast, a relatively collimated sputtered flux can be achieved by placing a collimator between the cathode and the substrate. The collimator is typically an array of thin-walled hexagonal cells designed to restrict the angular divergence of the flux while providing the acceptable flux throughput and minimal particle shedding consistent with manufacturing goals. The 1:1 aspect ratio collimator depicted in FIG. 1 limits the transmission of sputtered atoms to those which travel towards the wafer with an angle less than 45 degrees away from the surface normal. Accordingly, collimated sputtering reduces the difference in atomic fluxes seen by the upper and lower surfaces of the feature and the likelihood of formation of a residual void from overburden coalescence near the top of the feature.

In an alternative embodiment, a collimated flux can be achieved by increasing the source to substrate distance and sputtering at sub-mT pressures.

The artisan will appreciate that other similar mechanical means for inducing directivity, such as masks deposed in the deposition flux, and also anisotropic emission of the deposited species such as by directional arcs or flame spraying, may also be useful in alternative embodiments of the present invention.

In another alternative embodiment, the direction of the deposited flux may be controlled by imparting a charge to the deposited species, such as by glow discharge methods known in the art which include electron cyclotron resonance methods (ECR), certain partially ionized beam deposition methods (PIB; see, for example, L. K. Fionova, et al., Thin Solid Films, 227, 54, 1993), and certain arc methods, and subsequently passing the flux of charged species through an electric, magnetic, or similar equivalent field during the deposition process.

The artisan will appreciate that the films of the present invention may be patterned by any known patterning method, including without limitation, damascene methods, reactive ion etching methods, and lift off methods.

In various alternative embodiments, the process of the present invention is particularly useful for depositing aluminum alloys further comprising a metal selected from the group consisting of lithium, magnesium, niobium, palladium, scandium, vanadium, and zinc. Where the alloy further comprises a metal selected from the group consisting of niobium, palladium, scandium, and vanadium, which metals are relatively less soluble in aluminum, the concentration of the niobium, palladium, scandium, or vanadium is selected to be less than the solubility limit of such metal at the process temperature. In a preferred embodiment, the alloying metal is magnesium. Where the aluminum alloy is selected to be an alloy comprising aluminum and magnesium, the preferred magnesium concentration comprises from about 0.05 to about 10 percent by weight of the aluminum alloy. In a more preferred embodiment, the magnesium comprises from about 1 to about 3 percent by weight of the aluminum alloy. In a yet more preferred embodiment, the magnesium comprises about 2 percent by weight of the aluminum alloy.

In the present invention, by precipitate is meant a compositionally discrete region of a solid that has formed by expulsion from a saturated solvent phase. More particularly, precipitates are a discontinuous minority phase with respect to a continuous, doped Al matrix.

Coherent precipitates are structurally very similar to the surrounding lattice. They may have the same crystal structure and orientation as the lattice, or a crystal structure and orientation such that registration is maintained between the precipitate and surrounding lattice. Since there is registration at the interface and a compositional discontinuity, there is some strain at the interface. This strain typically constrains the size and orientations of coherent precipitates.

Incoherent precipitates are compositionally and structurally discrete from the surrounding lattice, and are separated from the lattice by grain boundaries. Grain boundaries are regions where crystal lattice registration is significantly disturbed. The boundaries can be more or less disturbed (low-angle vs high-angle boundaries). Since coherent precipitates are registered with the lattice, dislocations (line defects) and grain boundaries can move through the precipitate under certain conditions, such as in response to heat or applied stress. Thus coherent precipitates do not much hinder refining of the microstructure, such as occurs during grain growth, where grain boundaries move and smaller oddly shaped grains are generally consumed by larger, six-sided grains. On the other hand, incoherent precipitates can pin dislocations and grain boundaries, interfering with refinement.

We now disclose the surprisingly advantageous effects of using directionally controlled deposition processes on the metallurgical properties and electromigration characteristics of AlMg alloys, in comparison to AlCuSi alloys. In a typical process, single-level damascene electromigration test wiring elements were fabricated from aluminum alloys comprising magnesium, or in comparative examples, copper, deposited by either collimated or uncollimated sputtering. The wiring elements were then stressed to induce electromigration failures. Collimation has only a small effect on the failure rates of elements comprising AlCuSi, but has a large effect on elements comprising AlMg. Specifically, the median time to electromigration failure for collimated AlMg elements was about 10 times the value for uncollimated AlMg elements and about 6 times the values for collimated and uncollimated AlCuSi elements. Transmission electron microscope (TEM) and x-ray diffraction (XRD) analyses of these films show that the collimation-induced improved resistance to electromigration failure in AlMg $T_{50}$ is associated with the formation of smaller, lower strain grains which are clustered in very well-oriented (111) domains having improved texture. By $T_{50}$ is meant the median time to failure of a population of wiring elements. By improved texture is meant a more uniform angular orientation of individual grains within the film. A collimated deposition process which does not produce incoherent precipitates within the deposited grains will produce films having these desirable metallurgical properties.

The following are typical process conditions which apply to all the examples. On 150-mm diameter wafers, troughs 0.8 μm-deep, 1.2 μm-wide, and 800 μm-long were etched in plasma-enhanced, chemical vapor deposited (CVD) $SiO_2$ from tetraethoxysilane (TEOS). Such low aspect ratio features were chosen to minimize the effect of differential fill on the electromigration results. All metal depositions were accomplished using planar cathodes in the same cryopumped module of a load-locked single-wafer physical vapor deposition (PVD) Varian model M-2000 cluster tool.

The module base pressure was $2 \times 10^{-8}$ Torr. The heater table was maintained at 300° C. Uncollimated depositions were performed using 7 kW cathode power and 4 mT of Ar gas. Collimated depositions were performed using 20 kW cathode power and 0.8 mT of Ar gas. Both sets of conditions yielded deposition rates of 7 nm/s. Each wafer was processed for 2.4 minutes, resulting in 1000 nm of deposited Al alloy. Each experimental sample contained five wafers. Wafers were subsequently planarized using a non-optimized chemical-mechanical polish. The typical polished metal wire thickness was 0.5 μm as determined by SEM. The wafers were then annealed at 400° C. for 20 minutes in forming gas ($N_2/10\%H_2$) to stabilize the microstructures. Finally, 500 nm of plasma TEOS was deposited on the damascene wires and contact holes were opened for probing.

The microstructures of blanket regions of patterned and unpatterned deposited alloy films were determined by TEM analysis. For both deposition conditions, the AlCuSi microstructures exhibit few defects such as dislocations or large precipitates. Furthermore, little strain is evident and the grain boundaries have conventional appearance. However, the AlMg film microstructure is dramatically modified by collimation. The uncollimated AlMg film microstructure consists of a highly strained lattice containing many dislocations, precipitates and 20-nm scale coherent platelets. Furthermore, the grain boundaries are jagged in shape and suggest grains that are far from equilibrium. By contrast, the collimated AlMg film microstructure displayed little strain, few dislocations and few precipitates. Platelets were again observed, though at 20% of the frequency resulting from uncollimated deposition, indicating reduced lattice disruption. The grain boundaries were largely conventional in shape, although four-sided grains were commonly observed around the more conventional six-sided grains. The presence of four-sided grains is distinctly unusual, and unexpected, since such grains are expected to be consumed during grain growth. The fact that such grains are present indicates an unusual degree of grain boundary stability consistent with the highly oriented grain structure.

Figure 2:
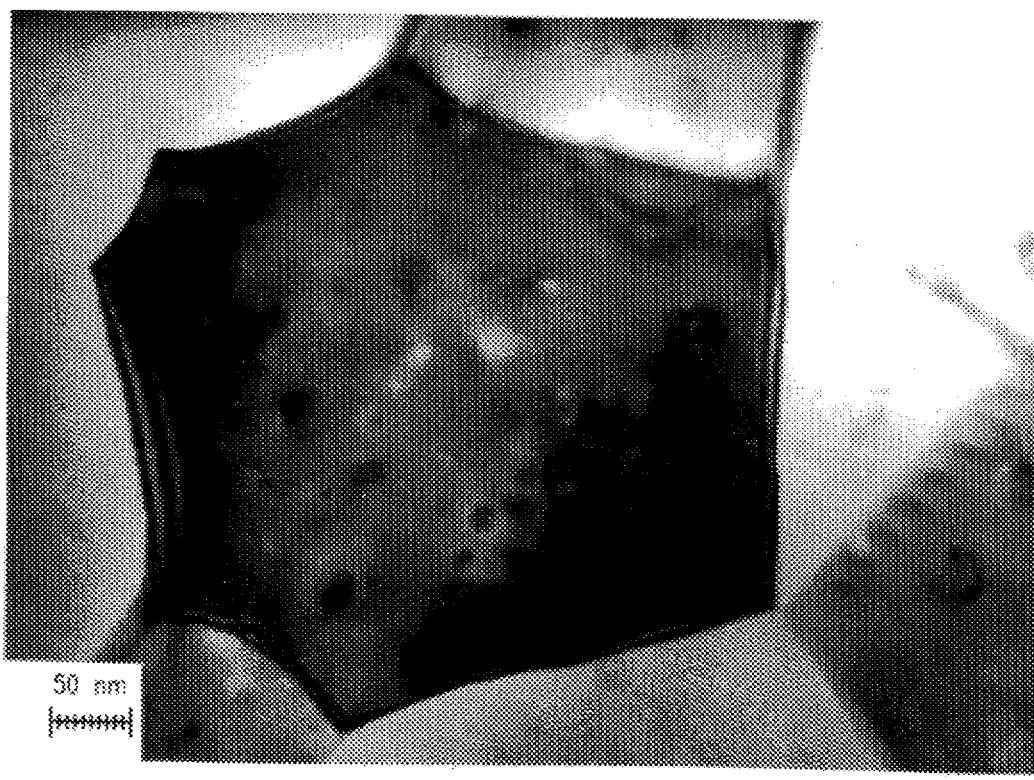
FIG. 2 is a transmission electron micrograph of a single grain from a thin film comprising aluminum magnesium alloy.

FIG. 2 shows a TEM image of one collimated AlMg grain, including coherent platelets in various orientations. Selected area electron diffraction (SAD) indicated that the 0.13-μm scale grains are typically clustered in well-oriented domains extending over 10 μm or more.

In most embodiments, the present method forms aluminum alloy films consisting of grains generally lacking incoherent precipitates within the deposited metal film. In preferred alternative embodiments, the present method forms aluminum alloy films consisting of grains having coherent precipitates within the deposited metal film.

The preferential orientations of the four films were studied in greater depth using x-ray diffraction (XRD) pole figures analysis of blanket films. Samples were examined in the Schultz reflection geometry (L. G. Schultz, J. Appl. Phys. 20, 1030, 1949) where the theta and 2*theta diffracting conditions are fixed on the (111) reflection. Intensity [$I_{(111)}$] data were obtained as a function of tilt angle from the normal direction (phi), corrected for focus considerations, normalized by the random intensity and evaluated as fiber plots of log [$I_{(111)}$] versus phi.

Figure 3:
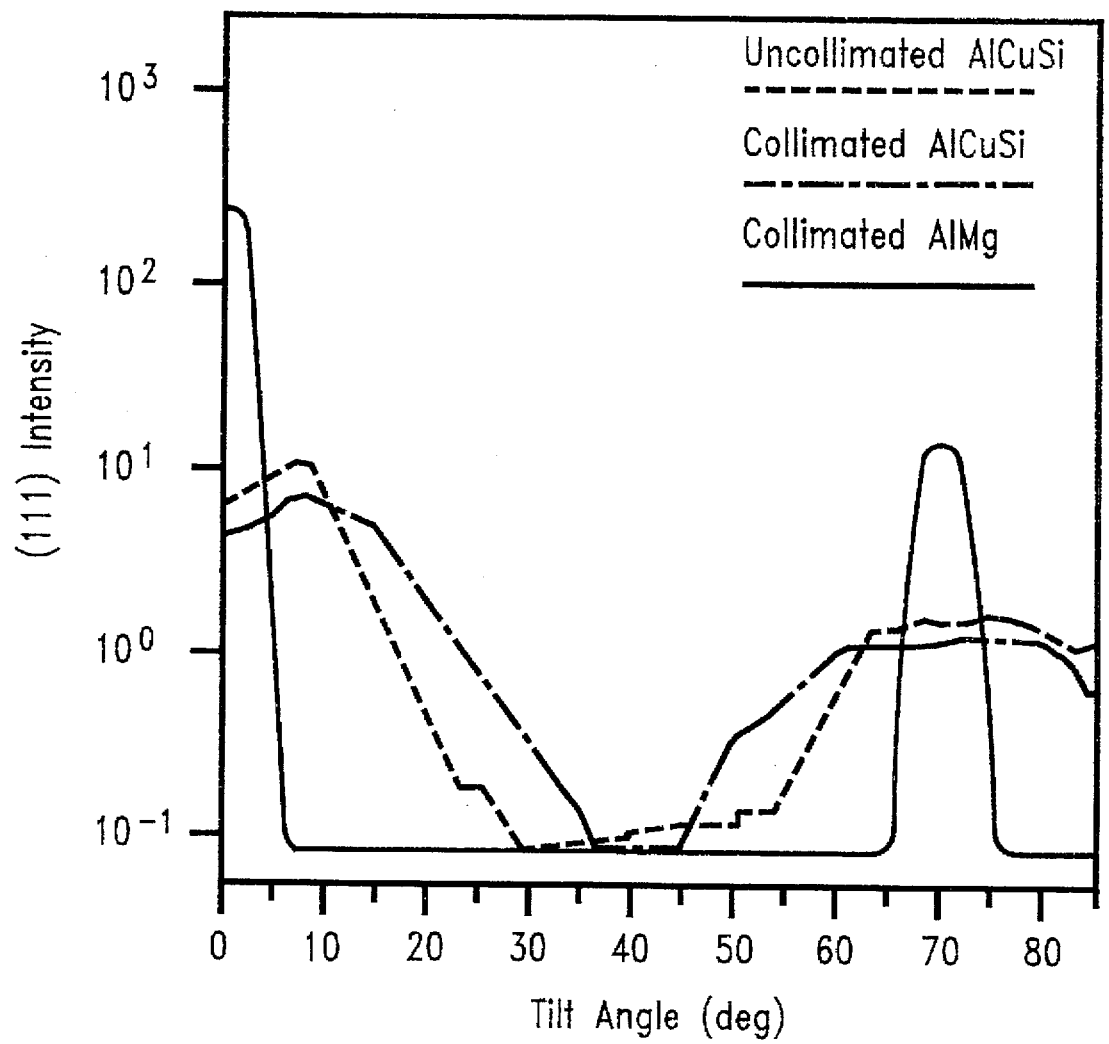
FIG. 3 is a graph showing x ray diffraction data from various sputtered metal thin films.

FIG. 3 shows the pole figure results for uncollimated AlCuSi, collimated AlCuSi, and collimated AlMg blanket films. Uncollimated AlMg films were not analyzed by XRD, but were observed to have very little preferential orientation by SAD in the TEM. All three depositions display a (111) fiber texture. Parameters extracted from this data are shown in Table 1, which lists the (111) and random volume fractions, as well as the 90% and 63% integrated intensity distribution widths for the four metal samples. This data provides a quantitative basis for the TEM observation that collimation has a negligible effect on the AlCuSi microstructure, but induces strong preferential orientation in the AlMg alloy.

TABLE I

Texture Parameters From X-Ray Diffraction Pole Figures

| Alloy/ Process | Median Grain Size | Volume Fraction (111) | Volume Fraction Random | (111) Distribution Width $W_{90}$ | (111) Distribution Width $W_{63}$ |
|---|---|---|---|---|---|
| Uncoll.-AlCuSi | 0.63 μm | 0.91 | 0.09 | 15.3 | 10.2 |
| Coll.-AlCuSi | 0.65 μm | >0.92 | 0.08* | 23.1 | 14.6 |
| Coll.-AlMg | 0.13 μm | >0.92 | 0.08* | 3.3 | 2.2 |

*The resolution limit is 0.08.

In one embodiment of the invention, deposited films were obtained in which greater than about 75 volume % of the aluminum alloy film consists of grains having a (111) orientation and wherein greater than about 63% of said grains having a (111) orientation have a tilt angle of less than about 10 degrees. In a preferred embodiment, greater than about 75 volume % of the aluminum alloy film consists of grains having a (111) orientation and wherein greater than about 63% of said grains having a (111) orientation have a tilt angle of less than about 5 degrees. In a more preferred embodiment, greater than about 90 volume % of the aluminum alloy film consists of grains having a (111) orientation and wherein greater than about 90% of said grains having a (111) orientation have a tilt angle of less than about 4 degrees.

Figure 4:
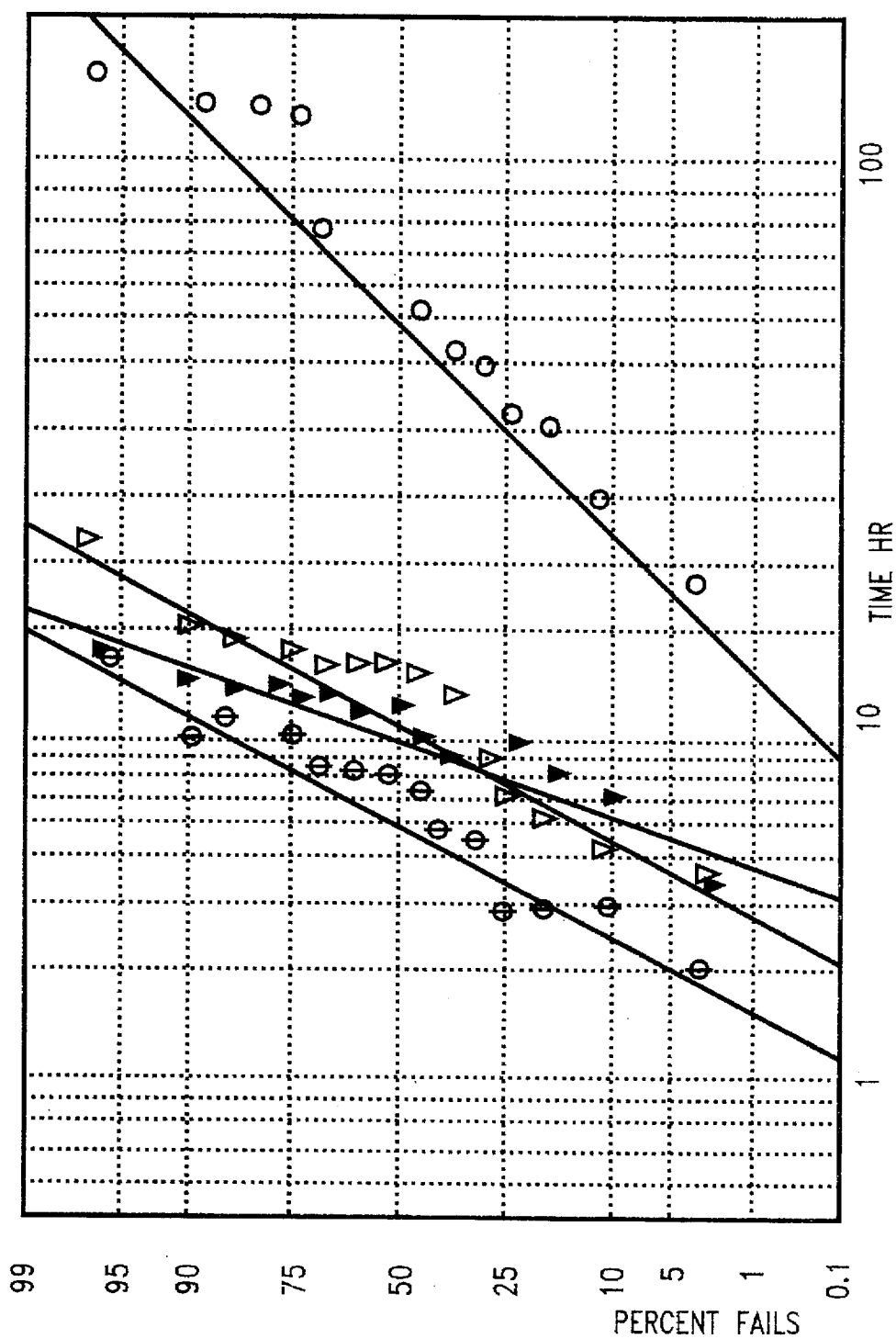
FIG. 4 is a graph showing electromigration failure data for wiring elements formed from thin films comprising aluminum alloys.

The damascene wiring elements were stressed to induce electromigration failures at 250° C. using a nominal current of 20 mA/μm². A log-normal plot of the accumulated failures over time is shown in FIG. 4. All four deposition samples are reasonably well-described by linear fits, though there may be some evidence of bimodality in the failure data. For AlCuSi, the collimated sample exhibits almost the same $T_{50}$ as the uncollimated sample, that is about 10 hours, though with a wider distribution (smaller slope) and higher sigma. By contrast, collimation seems to have had a drastic effect on the AlMg electromigration failures. The uncollimated AlMg wiring had a $T_{50}$ of 5.6 hours, the shortest of all the samples, while the collimated AlMg sample yielded a $T_{50}$ of 60.0 hours, the longest observed in this experiment and a 10 times improvement over the uncollimated condition. However, the slopes and sigmas for the two distributions are similar.

Table 1 also shows the typical grain size for each film. The collimated deposition process had a very small effect on the AlCuSi films, which show a median grain size of about 0.65 μm. However, the median grain size for the AlMg has been significantly reduced by collimation to 0.13 μm, which is about one third the size of AlMg grains obtained from an uncollimated process. This result is counterintuitive to the conventional understanding in the art, since smaller grains are usually associated with shorter $T_{50}$s, thus the improved resistance to electromigration failure of wiring elements formed from alloys deposited by a highly directional process is clearly surprising.

Upon a reading of the present disclosure, it will be apparent to the skilled artisan that other embodiments of the present invention beyond those embodiments specifically described herein may be made or practiced without departing from the spirit of the invention. Similarly, changes, combinations and modifications of the presently disclosed embodiments will also become apparent. The embodiments disclosed and the details thereof are intended to teach the practice of the invention and are intended to be illustrative and not limiting. Accordingly, such apparent but undisclosed embodiments, changes, combinations, and modifications are considered to be within the spirit and scope of the present invention as limited solely by the appended claims.

What is claimed is:

1. In a process for depositing a metal film from a deposition source onto an integrated circuit substrate, said process comprising the step of using a means for collimating the direction of a metal striking the substrate, the improvement wherein said metal film comprises a magnesium-containing aluminum alloy film having greater than about 75 volume % of grains having a (111) orientation, and wherein greater than about 63% of said grains having a (111) orientation have a tilt angle of less than about 10 degrees.

2. In a process for depositing a metal film from a deposition source onto an integrated circuit substrate, said process comprising the step of using a means for collimating the direction of a metal striking the substrate, the improvement wherein said metal film comprises a magnesium-containing aluminum alloy film consisting of grains lacking incoherent precipitates within the deposited metal grains.

3. In a process for depositing a metal film from a deposition source onto an integrated circuit substrate, said process comprising the step of using a means for collimating the direction of a metal striking the substrate, the improvement wherein said metal film comprises a magnesium-containing aluminum alloy film consisting of grains having coherent precipitates within the deposited metal grains.

4. A process for sputter depositing an aluminum alloy film onto an integrated circuit substrate comprising the steps of:
   a) obtaining a deposition source comprising aluminum alloyed with magnesium; and
   b) using a collimator deposed between said deposition source and said substrate, sputter depositing material from said deposition source onto said substrate to form said aluminum alloy film.

5. The process of claim 4 wherein the magnesium comprises from about 0.05 to about 10 percent by weight of the aluminum alloy.

6. The process of claim 4 wherein the magnesium comprises from about 1 to about 3 percent by weight of the aluminum alloy.

7. The process of claim 4 wherein the magnesium comprises about 2 percent by weight of the aluminum alloy.

8. The process of claim 4 wherein greater than about 75 volume % of the aluminum alloy film consists of grains having a (111) orientation and wherein greater than about 63% of said grains having a (111) orientation have a tilt angle of less than about 10 degrees.

9. A process for depositing a magnesium-containing aluminum alloy onto an integrated circuit substrate comprising the steps of:
   providing a deposition source for depositing a magnesium-containing aluminum alloy; and
   using means for controlling the direction of the alloy striking an integrated circuit substrate, wherein the controlling means is means for collimating.

10. The process of claim 1 wherein the concentration of said magnesium in said alloy is less than the solubility limit of said magnesium in said alloy at the temperature of said alloy during the deposition process.

11. The process of claim 9 wherein the magnesium comprises from about 0.05 to about 10 percent by weight of the aluminum alloy.

12. The process of claim 9 wherein the magnesium comprises from about 1 to about 3 percent by weight of the aluminum alloy.

13. The process of claim 9 wherein the magnesium comprises about 2 percent by weight of the aluminum alloy.

14. The process of claim 9 wherein greater than about 75 volume % of the deposited aluminum alloy consists of grains having a (111) orientation and wherein greater than about 63% of said grains having a (111), orientation have a tilt angle of less than about 10 degrees.

15. The process of claim 9 wherein greater than about 75 volume % of the deposited aluminum alloy consists of grains having a (111) orientation and wherein greater than about 63% of said grains having a (111) orientation have a tilt angle of less than about 5 degrees.

16. The process of claim 9 wherein greater than about 90 volume % of the deposited aluminum alloy consists of grains having a (111) orientation and wherein greater than about 90% of said grains having a (111) orientation have a tilt angle of less than about 4 degrees.

17. The process of claim 9 wherein the aluminum alloy consists of grains lacking incoherent precipitates within the deposited metal grains.

18. The process of claim 9 wherein the aluminum alloy consists of grains having coherent precipitates within the deposited metal grains.

* * * * *